United States Patent [19]

Nakano et al.

[11] Patent Number: 5,506,449

[45] Date of Patent: Apr. 9, 1996

[54] INTERCONNECTION STRUCTURE FOR SEMICONDUCTOR INTEGRATED CIRCUIT AND MANUFACTURE OF THE SAME

[75] Inventors: Tadashi Nakano; Hideaki Ono, both of Chiba, Japan

[73] Assignee: Kawasaki Steel Corporation, Hyogo, Japan

[21] Appl. No.: 216,337

[22] Filed: Mar. 23, 1994

[30] Foreign Application Priority Data

Mar. 24, 1993 [JP] Japan .................................. 5-065415
Mar. 26, 1993 [JP] Japan .................................. 5-068260

[51] Int. Cl.$^6$ ........................... H01L 23/48; H01L 23/52; H01L 29/40
[52] U.S. Cl. ........................... 257/758; 257/761; 257/762; 257/770
[58] Field of Search .................... 257/758, 759, 257/760, 762, 765, 767, 771, 751, 753, 761, 763, 764, 770

[56] References Cited

U.S. PATENT DOCUMENTS

| | | | |
|---|---|---|---|
| 3,906,540 | 9/1975 | Hollins | 257/751 |
| 4,141,022 | 2/1979 | Sigg et al. | 257/751 |
| 4,829,363 | 5/1989 | Thomas et al. | 257/761 |
| 4,980,752 | 12/1990 | Jones | 257/763 |
| 4,985,750 | 1/1991 | Hoshino | 357/71 |
| 5,132,756 | 7/1992 | Matsuda | 257/763 |
| 5,236,869 | 8/1993 | Takagi et al. | 437/190 |
| 5,264,728 | 11/1993 | Ikeda et al. | 257/761 |
| 5,302,552 | 4/1994 | Duchateau | 437/200 |
| 5,341,016 | 8/1994 | Prall et al. | 257/915 |
| 5,345,108 | 8/1994 | Kikkawa | 257/763 |

FOREIGN PATENT DOCUMENTS

| | | |
|---|---|---|
| 53-116089 | 11/1978 | Japan . |
| 63-73645 | 4/1988 | Japan . |
| 63-156341 | 6/1988 | Japan . |
| 1-204449 | 8/1989 | Japan . |
| 1-202841 | 8/1989 | Japan . |

OTHER PUBLICATIONS

"IBM Technical Disclosure Bulletin", Method of Fabricating Gold Interconnections With Tantalum–coated Vertical and Horizontal Surfaces.

*Primary Examiner*—Sara W. Crane
*Assistant Examiner*—Jhihan Clark
*Attorney, Agent, or Firm*—Oliff & Berridge

[57] ABSTRACT

An interconnection structure for semiconductor integrated circuits and the method for manufacturing of the same are provided. The interconnection structure has a low electric resistance and a good electromigration resistance and can prevent the atoms in wire materials from diffusing into insulating films or substrates. More particularly, an insulating film 12 is formed on a silicon substrate 10, on which a tungsten 14 is formed. The tungsten film 14 is subjected to plasma irradiation on the surface thereof to form an amorphous W—N film 16. A copper wire pattern 20 is formed on the amorphous W—N film 16.

21 Claims, 5 Drawing Sheets

INTERCONNECTION STRUCTURE FOR SEMICONDUCTOR INTEGRATED CIRCUIT AND MANUFACTURE OF THE SAME

BACKGROUND OF THE INVENTION

1. Field of the Invention

This invention relates to an interconnection structure for semiconductor integrated circuits (LSI) and the manufacture thereof.

2. Description of the Related Art

At present, interconnection used for semiconductor integrated circuits include Al and Al alloys wherein Si or Cu is added to Al. Since Al is employed as a main component for the interconnection, the allowable current density is limited to the range not higher than $(2 \text{ to } 3) \times 10^5$ A/cm$^2$. When a current exceeding the above-indicated allowable current density is applied to the interconnection, it will be broken down owing to the electromigration. Especially, in recent years, there is a growing tendency toward the reduction in size of the interconnection accompanied by an increase in degree of the integration. Accordingly, the problem on the electromigration becomes more severe.

Aluminum alloys generally have a high electric resistivity. As an interconnection is made narrower, the resistance thereof inevitably increases. This results in the great increase of the interconnection delay time owing to the large time constant. Accordingly, the merit of improving the switching velocity of the transistor will be offset. Another problem arises in that reliability becomes low owing to the heat generation due to the high density current applied to such an interconnection with a high resistance.

Under these circumstances, in order to improve the electromigration resistance of the interconnection and to lower the resistance thereof, there has been proposed the use of a Cu interconnection, which is substantially made of Cu having a high electromigration resistance and a low resistivity, in place of the Al or Al alloy interconnection.

However, Cu is more easy to diffuse into Si (substrate) or SiO$_2$ (insulating film) than Al. When Cu is used as an interconnection material, there arises the problem that Cu diffuses to the active region thereby forming an acceptor level. This causes the carrier density to be reduced, thereby degrades the characteristics of the transistor. To solve this problem, there have been proposed techniques wherein Cu is prevented from diffusing by forming a barrier film made of various types of materials as an underlying layer or a covering layer for the Cu wire (such as set out, for example, in Japanese Laid-open Patent Application Nos. 53-116089, 63-73645, 63-156341 and 1-204449). However, the diffusion of Cu through the barrier film into Si or SiO$_2$ cannot be well prevented, with satisfactory results being not obtained. Further, there have been proposed a technique of forming a barrier film which is made of a nitride such as Ti—N, W—N or the like or a carbide such as Ti—C, W—C or the like (U.S. Pat. No. 4,985,750) and a technique wherein a barrier film is formed by oxidizing the surface of Ti—N film (U.S. Pat. No. 5,236,869). However, the nitrides have a high electric resistivity, thus presenting the problem that the resistance of the interconnection with nitride barrier layer becomes higher than that of the interconnection with the barrier film made, for example, of W.

Moreover, there has been proposed the use of nitrides and borides of such as of Zr, Ti, Ta and the like as an underlying layer for the Cu wire (Japanese Laid-open Patent Application No. 1-202841). Although adhesion to an insulating film is improved, Cu cannot be adequately prevented from diffusing.

Like Cu, Au and Ag are lower in electric resistivity than Al and exhibit a high electromigration resistance, thus being promising. However, they are easy to diffuse into Si or SiO$_2$ as Cu. This requires a barrier film which has a high barrier effect and does not increase the resistance of the interconnection electrode structure.

With the Al electrode, it is usual to use an alloy having Cu added thereto so as to improve the electromigration resistance of the interconnection. In this case, a barrier film is necessary for preventing the Cu from diffusing.

DISCLOSURE OF THE INVENTION

Under these circumstances, the present invention has for its object the provision of an interconnection structure for semiconductor integrated circuits and the method for manufacturing of the same wherein the electromigration resistance of an interconnection is improved while suppressing the atoms of a wire material from diffusing into insulating films or substrates.

In order to achieve the above object, according to a first embodiment of the invention, there is provided an interconnection structure for semiconductor integrated circuits which comprises a wire pattern consisting of a metal selected from Cu, Cu alloys, Au, Au alloys, Ag, Ag alloys, and Al—Cu alloys, characterized by comprising a barrier layer, which comprises at least one stacked layer consisting of a film of a metal compound selected from the group consisting of nitrides, borides and carbides and a metal film, as an underlying layer and/or a covering layer for the wire pattern. Preferably, the metal compound film should be amorphous in nature. More preferably, the metal compound film should be either an amorphous tungsten nitride film or an amorphous tungsten alloy nitride film.

It is also preferred that the metal compound film consists of an amorphous transition metal nitride film having a thickness within a range of 10 Å to 100 Å.

According to a second embodiment of the invention, there is provided an interconnection structure for semiconductor integrated circuits which comprises a wire pattern consisting of a metal selected from Cu, Cu alloys, Au, Au alloys, Ag, Ag alloys, and Al—Cu alloys, characterized by comprising a barrier layer, which comprises at least one stacked layer consisting of a metal film and a metal nitride film formed on the metal film and formed from the metal in the metal film, as an underlying layer and/or a covering layer for the wire pattern.

The metal film should preferably be a film selected from (1) a Ta film, (2) a W film, (3) a Ta—W alloy film, (4) a film of a Ta alloy to which at least one metal selected from Mo, Nb and Ti is added, (5) a film of a W alloy to which at least one metal selected from Mo, Nb, Pd and Pb is added, and (6) a film of a Ta—W alloy to which Mo and/or Nb is added.

According to a third embodiment of the invention, there is provided an interconnection structure for semiconductor integrated circuits characterized by comprising a wire pattern consisting of a metal selected from Cu, Cu alloys, Au, Au alloys, Ag, Ag alloys, and Al—Cu alloys and a barrier layer made of a member selected from nitrides, borides and carbides of Ta—W alloys and formed as an underlying layer and/or a covering layer for the wire pattern.

According to a fourth embodiment of the invention, there is also provided an interconnection structure for semiconductor integrated circuits characterized by comprising a wire pattern consisting of a metal selected from Cu, Cu alloys, Au, Au alloys, Ag, Ag alloys, and Al—Cu alloys and a barrier layer made of a member selected from nitrides, borides and carbides of Ta—W alloys, to which Mo and/or Nb has been further added, and formed as an underlying layer and/or a covering layer for the wire pattern.

According to a fifth embodiment of the invention, there is further provided an interconnection structure for semiconductor integrated circuits characterized by comprising a wire pattern consisting of a metal selected from Cu, Cu alloys, Au, Au alloys, Ag, Ag alloys, and Al—Cu alloys and a barrier layer made of a member selected from nitrides, borides and carbides of Ta alloys, to which at least one metal selected from Mo, Nb and Ti has been added, and formed as an underlying layer and/or a covering layer for the wire pattern.

According to a sixth embodiment of the invention, there is provided a wire pattern consisting of a metal selected from Cu, Cu alloys, Au, Au alloys, Ag, Ag alloys, and Al—Cu alloys and a barrier layer made of a member selected from nitrides, borides and carbides of W alloys, to which at least one metal selected from Mo, Nb, Pd and Pb has been added, and formed as an underlying layer and/or a covering layer for the wire pattern.

The carbides, borides and carbides may, respectively, include, aside from those which exist as compounds, carbides, borides and carbides of the respective alloys which partially contain N, B and/or C as penetrated or substituted atoms.

The method for manufacturing of the interconnection structure for semiconductor integrated circuits according to the invention is characterized by comprising the steps of forming a metal film on an insulating film, subjecting the metal film to irradiation with a plasma thereby forming a metal nitride thin film on the surface of the metal film, and forming a wire pattern of a metal on the metal nitride thin film.

Preferably, the plasma is one which is generated by accelerated electrons under electron cyclotron resonating conditions.

The plasma nitrided metal thin film should preferably have a thickness of 10 angstroms to 100 angstroms.

The metals for the metal film used to manufacture the interconnection structure are not critical with respect to the type thereof. Preferably, there are used Ti, Nb, Ta and W which are easily formed as a thin film and are capable to form a stable, dense nitride thereof. The metal film is formed as a crystalline film using, for example, a sputtering, vacuum deposition or the like technique. It is preferred that the surface of the metal film is subjected to exposure to the ECR (electron cyclotron resonance) plasma, thereby forming a plasma-nitrided metal thin film only on the surface portion of the metal film.

In the interconnection structure of the semiconductor integrated circuits according to the first embodiment of the invention, the barrier layer consists of at least one barrier layer which includes a film of a metal having a relatively low resistivity, such as W, Mo, Ta or the like, and a film of a metal compound stacked on the metal film and having a relatively good diffusion suppressing effect, such as W—N, Nb—N, Mo—N, Ti—N or the like. Accordingly, good barrier performance can be attained without adversely influencing the interconnection structure with respect to its resistance.

In the barrier layer having a stacked structure, better barrier performance is obtained by using an amorphous film as the metal compound film having the relatively high diffusion suppressing effect. Where polycrystalline materials are used as the barrier layer, Cu, Au or Ag will diffuse through the grain boundary having a high diffusion coefficient. Accordingly, it is not necessarily effective to prevent the diffusion when using, as the barrier layer, a polycrystalline film of a metal or metal compound, such as W, Ti—N, Zr—N or the like, which has a small diffusion coefficient against Cu, Au or Ag. In turn, using an amorphous film, which is free of any grain boundary, as the barrier layer, a rapid diffusion through the boundary can be effectively prevented. Other techniques of preventing the diffusion through the grain boundary may include use of a single crystal film as the barrier layer. In practice, however, it is very difficult to form a defect-free single crystal film over the entire surface of a substrate.

Where an amorphous material is employed as one of the films in the stacked structure of the barrier layer, it is general that the diffusion rate of Cu, Au or Ag becomes smaller when the self-diffusion coefficient of the film is smaller. This is because the diffusion through the grain boundary is negligible.

Hence, use of high melting point transition metal nitrides which are small in the self-diffusion coefficient as the amorphous material contributes to significant improvement of the barrier properties.

When an amorphous transition metal nitride is used as one of the films in the barrier layer having the stacked structure, its formation method is not critical. In general, the metal film with low resistivity, which is one of the stacked layer, and the amorphous transition metal nitride film are successively formed by vacuum deposition. For one instance, a metal film having low resistivity, which is one of the stacked layers, is formed using chemical vapor deposition (CVD) or sputtering. In the same apparatus as for the metal film or in another apparatus, a transition metal nitride film having high barrier properties is subsequently formed by sputtering or reactive sputtering under conditions capable to form an amorphous film. In this procedure, however, limitation is placed on the range of controlling the film thickness of the transition metal nitride.

Alternatively, the metal film used as the having low resistivity may be preliminarily formed, followed by irradiation with a nitrogen plasma to nitrize and to amorphize the surface of the metal film by means of the plasma energy. With this procedure, only the thin surface part of the metal film can be readily converted into a thin amorphous nitride film having very high barrier properties while keeping the thickness of the pre-formed, low resistance barrier film by appropriately controlling the irradiation time and energy of the plasma and the type of plasma source.

In the procedure for the plasma nitrization of the surface, W or its alloys should preferably be used. The resistivity of W is relatively low, so that the increase of the resistance due to the decrease of the width of the interconnection structure can be suppressed in a minimum. In addition, W is readily nitrided by irradiation with a nitrogen plasma, thereby forming amorphous W—N. The barrier properties of the amorphous W—N are much higher than ordinary metals or nitrides and such a nitride can prevent diffusion of Cu, Au or Ag when formed as a very thin film of approximately 20 angstroms in thickness.

For forming a stacked film of W—N/W, tungsten (W) is first formed on an insulating film by sputtering or a CVD method. A nitrogen plasma is then irradiated to the tungsten film. By this, the surface of the tungsten film is nitrided and converted to amorphous nitride film. The method of generating the nitrogen plasma should preferably be one which makes use of electron cyclotron resonance (ECR) because of the generation of a high density plasma. Cu film is, for example, subsequently formed on the stacked film by sputtering or a CVD method, followed by patterning of the Cu and W—N/W films. If necessary, thus formed wire pattern is subjected to selective CVD to cover or coat the peripheries thereof with tungsten. Thereafter, the surface of the tungsten is irradiated with a nitrogen plasma to form a surface nitrided film.

In the interconnection structure of semiconductor integrated circuits according to the second embodiment of the invention, the barrier layer should be comprised at least one stacked layer which consists of a metal film and a metal nitride film formed from the metal in the metal film. It has been found from X-ray diffraction analysis that the metal nitride film which is formed by plasma irradiation is substantially completely amorphous in nature. In contrast, the metal nitride films obtained by other methods such as, for example, reactive sputtering or CVD are generally crystalline metal nitride films. This means that the metal nitride film formed by plasma irradiation is better in suppressing the diffusion of Cu, Au or Ag through the grain boundary to insulating films or substrates. With tungsten nitride, a film in a state close to amorphous may be obtained by use of reactive sputtering in some particular conditions. However, it should be noted here that this film consists of a W-rich film where the compositional ratio between W and N is in the range of (2 to 4):1. In contrast, by use of the plasma irradiation, there can be obtained a film whose compositional ratio is close to 1:1, i.e. (1± 0.2):1. This type of tungsten nitride film exhibits high barrier properties. When the metal film is nitrided in the surface thereof by use of plasma nitrization, the surface of the barrier layer becomes smooth owing to the sputtering effect of the plasma on the film surface. This leads to an improved flatness of the Cu or conductor film formed on the barrier layer surface, thereby significantly decreasing a density of defects formed during the patterning step.

W, Ta and Ta—W alloys are more chemically stable than other metals and undergo little reaction with Cu, Au or Ag when subjected to thermal treatment, thus enabling one to suppress the resistance of the interconnection structure from increasing. When the elements set out hereinbefore in (4) to (6) are added to these metals or alloys, the film density and barrier properties are further improved.

The nitride layer obtained by the irradiation of plasma is so thin as not greater than 100 angstroms. In order to further improve the barrier performance, the steps of forming the W, Ta or W—Ta film and nitrizing the film surface by plasma are repeated to increase the ratio of the nitride films thickness to the total barrier layer thickness. By this, the diffusion barrier effect to Cu, Au or Ag can be remarkably enhanced.

When the barrier layer is formed as having a multilayered structure, the roughness on the surface of the barrier layer as will be caused by the growth of crystal grains are become smaller than in the case of a single layer structure. So, along with the above-stated sputtering effect, the surface of the barrier layer becomes smoother. This contributes to improving the flatness of the metal film formed on the barrier film surface. Hence, the density of defect formed during the patterning step can be remarkably decreased. As a result, the interconnection structure of this embodiment can be processed according to an advanced patterning technique which is required for a fine interconnection structure of not larger than 0.25 μm in size.

The nitrides, borides and carbides of Ta—W alloys with or without a Mo and/or Nb additive element, Ta alloy and W alloys which are used in the interconnection structure for semiconductor integrated circuits according to the third to sixth embodiments of the invention are more chemically stable than Ta—W alloys with or without Mo and/or Nb additive elements, Ta alloy and W alloys and are very unlikely to react with Cu, Au or Ag at the time of thermal treatment. The grains of the alloy film are generally finer than those of a pure metal film. Thus, when subjected to nitrization with plasma, the alloy film can yield a more uniform amorphous nitride film. In addition, recrystallization through thermal treatment after the formation of the nitride is more unlikely to occur. Thus, when these nitrides, borides or carbides are employed as a diffusion barrier for the wire made of a metal selected from Cu, Cu alloys, Au, Au alloys, Ag, Ag alloys and Al—Cu alloys, good barrier effects are shown.

According to the method for manufacturing an interconnection structure of semiconductor integrated circuits of the invention, the surface of a metal film is irradiated with a plasma to form a plasma-nitrided metal thin film. By this, there can be uniformly formed a plasma-nitrided metal thin film with a thickness of 25 to 50 angstroms. This allows a thickness of the nitride film to be kept at a low level and it is very unlikely that the resistance of the interconnection becomes high. It will be noted that it is very difficult to form such a thin nitride film uniformly by other method such as by reactive sputtering.

When the method for manufacturing is applied to an interconnection structure made of Cu, Cu alloys, Au, Au alloys, Ag, Ag alloys and Al—Cu alloys, a plasma-nitrided metal thin film ensures a good barrier effect wherein diffusion of Cu, Au or Ag into an insulating film or substrate is prevented while keeping a low resistance of the structure.

As stated hereinbefore, the interconnection structure according to the first embodiment of the invention comprises, as an underlying and/or covering layer for a wire pattern, a barrier layer consisting of at least one stacked layer which comprises a metal film and a metal compound film on the metal film. By this arrangement, Cu, Au or Ag used as the wire is prevented from diffusing without any appreciable increase of the resistance of the interconnection. Thus, the interconnection structure for semiconductors having good reliability can be realized. Thus, the invention has a great industrial merit. When Cu is used as the wire, diffusion of Cu can be prevented while not increasing the resistance of the Cu interconnection. In this case, a reliable interconnection structure for semiconductors can be realized.

The interconnection structure according to the second embodiment of the invention comprises a barrier layer made of at least one stacked layer which includes a metal film and a nitride film of a metal constituting the metal film. When a film of a metal selected from Cu, Cu alloys, Au, Au alloys, Ag, Ag alloys and Al—Cu alloys is formed on the surface of the barrier layer, the surface of the metal film becomes smooth and density of the defects formed during the patterning step is remarkably decreased.

In the interconnection structure for semiconductor integrated circuits according to the third to sixth embodiments of the invention, nitrides, borides or carbides of Ta—W alloys with or without additive elements, Ta alloys and W alloys having good barrier properties are provided as an underlying and/or covering layer for a wire pattern consisting of a metal selected from Cu, Cu alloys, Au, Au alloys, Ag, Ag alloys and Al—Cu alloys. By this, there can be realized an interconnection structure wherein diffusion of Cu, Au or Ag used as the wire pattern can be satisfactorily suppressed. More particularly, the interconnection structure realized has a specific resistance lower than that of interconnection structure which comprises a wire pattern consisting of Al or Al alloys and has a good electromigration resistance, thus having a very great industrial merit.

DESCRIPTION OF THE PREFERRED EMBODIMENTS

Embodiments of the invention are described with reference to the accompanying drawings.

[First Embodiment]

In Table 1, there are shown the results of an experiment wherein barrier properties of various types of barrier materials against Cu are compared with one another. In this experiment, for comparing the barrier properties of films having stacked structures, each of various types of films is formed on a silicon substrate, on which a Cu film is formed, followed by diffusion of Cu through thermal treatment. A concentration of Cu, which arrives at the surface of the silicon substrate, is determined by SIMS (secondary ion mass spectroscopy).

In the respective samples, the barrier film is deposited on the silicon substrate in a total thickness of 600 angstroms, on which a 5000 angstrom thick Cu film is deposited by RF magnetron sputtering. After the formation, the respective samples were each subjected to thermal treatment in an atmosphere of hydrogen gas under conditions of 500° C.×1 hour, followed by measurement of a copper concentration in the surface of the silicon substrate. From Table 1, it will be seen that the barrier layers having stacked structures exhibit a significantly improved barrier effect of preventing diffusion of copper. Especially, the stacked structures comprising an amorphous nitride film are better. Moreover, it will be seen that the stacked structure comprising an amorphous tungsten nitride film formed by plasma nitrization is the most excellent.

TABLE 1

| Barrier Layer Structure | Concentration of Copper (relative value) | Remarks |
| --- | --- | --- |
| W 600 angstroms | 1.00 | Comparative Example |
| Ta 600 angstroms | 0.98 | Comparative Example |
| crystalline Ti—N 200 angstroms | 0.40 | Example |

TABLE 1-continued

| Barrier Layer Structure | Concentration of Copper (relative value) | Remarks |
| --- | --- | --- |
| (reactive sputtering)/W 400 angstroms | | |
| amorphous W—N 200 angstroms (reactive sputtering)/Ta 400 angstroms | 0.25 | Example |
| amorphous (Ti, W)—N 200 angstroms (reactive sputtering)/Ti—W (alloy film of Ti and W) 400 angstroms | 0.20 | Example |
| amorphous W—N 20 angstroms (plasma nitrization)/W 580 angstroms | 0.02 | Example |

Figure 1:
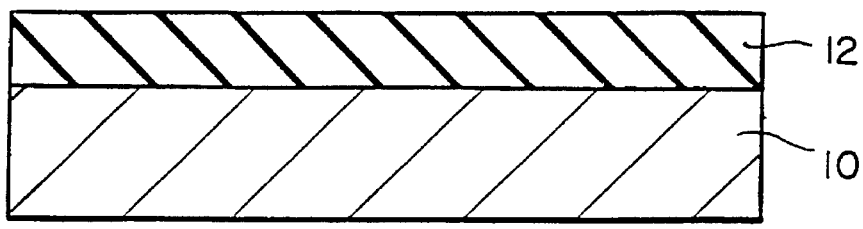
FIGS. 1 to 7 are, respectively, a sectional view showing the manufacture of an interconnection structure according to a first embodiment of the invention.
Figure 2:
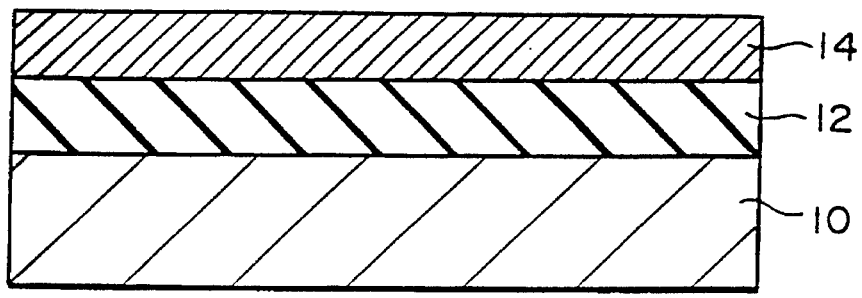
Figure 3:
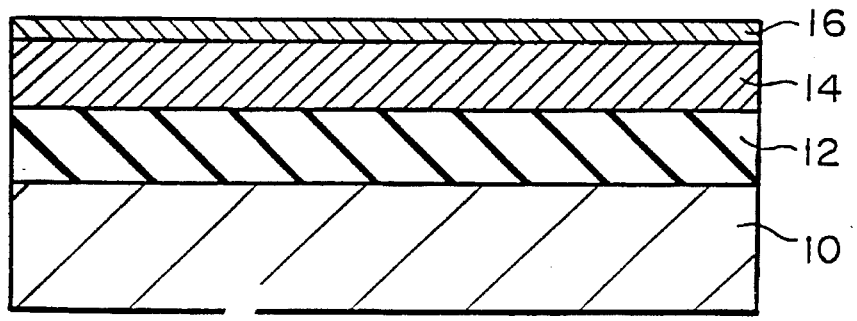
Figure 4:
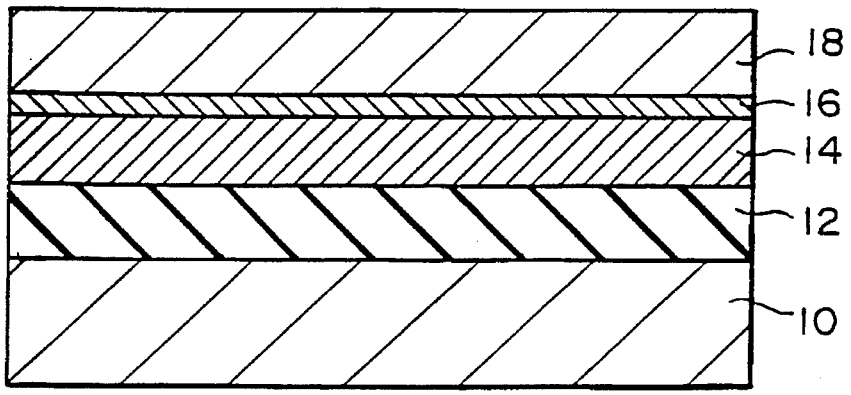
Figure 5:
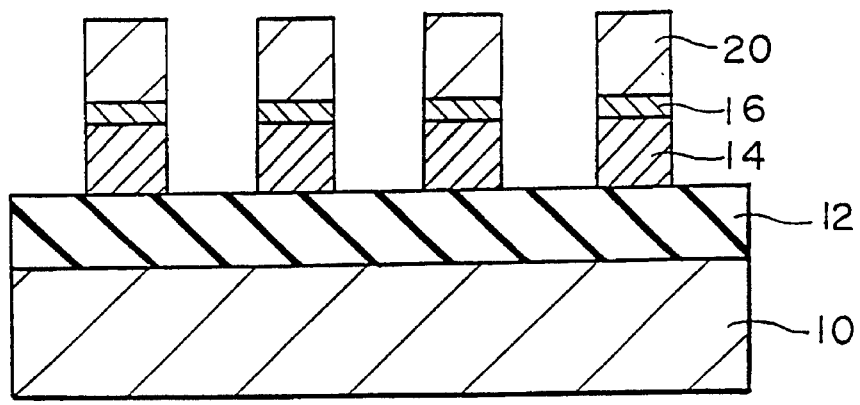
Figure 6:
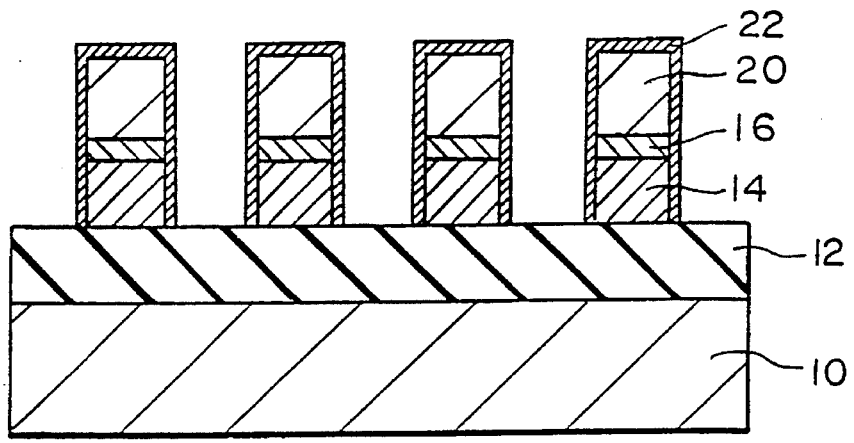
Figure 7:
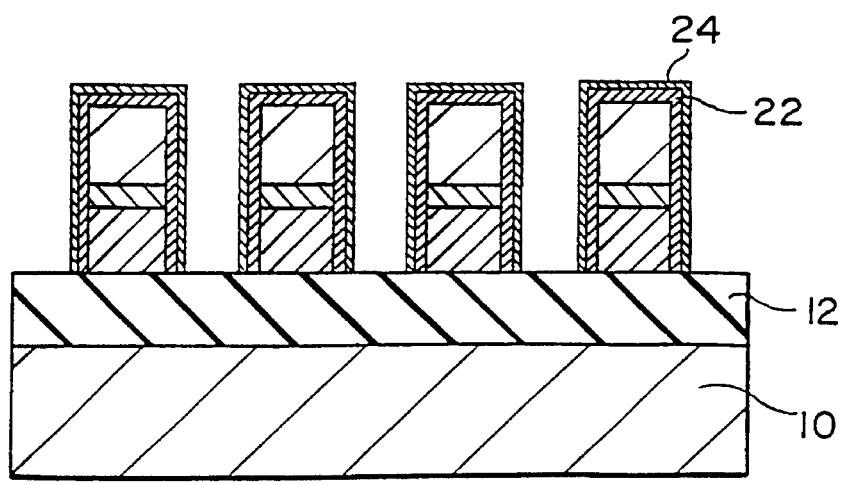

Reference is now made to FIGS. 1 to 7 to illustrate an interconnection structure and its manufacturing steps according to one embodiment of the invention. As shown in FIG. 1, a silicon substrate 10 is provided, on which a 5000 angstrom thick BPSG (borophosphosilicate glass) insulating film 12 is formed. As shown in FIG. 2, on the entire surface of the insulating film 12, a 600 angstroms thick tungsten film 14 is formed by use of RF magnetron sputtering in an atmosphere of argon at a total pressure of 2 mTorr, with a deposition rate of 10 angstroms/second. The tungsten film 14 is irradiated on the surface thereof with an ECR plasma generated under conditions of a nitrogen gas pressure of 1 mTorr, a nitrogen flow rate of 20 sccm and a microwave power of 600 W for 60 seconds to form an about 20 angstroms thick amorphous W—N film 16 as shown in FIG. 3. As shown in FIG. 4, a copper film 18 is subsequently formed on the surface of the amorphous W—N film using RF magnetron sputtering in an atmosphere of argon under conditions of a total pressure of 2 mTorr, and a deposition rate of 60 angstroms/second. As shown in FIG. 5, the copper film 18, W—N film 16 and tungsten 14 are patterned to form copper interconnection 20. Then, as shown in FIG. 6, tungsten is selectively deposited, using a CVD process, on the outer surfaces of the copper wire 20, W—N-film 16 and tungsten film 14 in a thickness of 400 angstroms to form a tungsten covering layer 22. The tungsten covering film 22 is formed with a condition wherein a sample temperature is set at 200° C. to 400° C. and a mixed gas of tungsten hexafluoride gas and hydrogen gas is fed to a deposition chamber while keeping the pressure of the gas at a level not higher than 1 Torr.

According to this deposition procedure, the surface reaction is the rate-limiting step so that selective deposition of tungsten only on the outer surfaces of the copper wire 20, W—N film 16 and tungsten film 14 is possible. Finally, the surface of the CVD tungsten film is again irradiated with an ECR plasma under conditions of a nitrogen gas pressure of 1 mTorr, a nitrogen flow rate of 20 sccm and a microwave output of 600 W for 60 seconds, thereby forming an about 20 angstroms thick amorphous W—N film 24.

In order to provide a multilevel interconnection structure, on the amorphous W—N film 24 is formed an insulating film such as of $SiO_2$ through an ordinary process, followed by formation of another interconnection structure on this insulating film in the same manner as set out above.

The thickness of the plasma nitrided film can be appropriately controlled by controlling the plasma power, acceleration voltage and substrate temperature. When using an ECR plasma, an about 20 angstroms thick W—N film can be formed without acceleration under conditions of a microwave power of 600 W and a room temperature substrate temperature for a nitrization time of not shorter than 40 seconds. This thickness scarcely increases even when the nitrization time is increased up to 5 minutes. The results of AES (auger electron spectroscopy) reveal that the compositional ratio between the W and N atoms present in the film is close to 1:1 ((1±0.2):1).

The thickness of the W—N film can be increased to 50 angstroms by increasing the substrate temperature up to 100° C. and to 100 angstroms by increasing the temperature up to 200° C. It will be noted, however, that even if the thickness is increased to 50 angstroms or over, any siginificant improvement of the barrier properties is not recognized. In contrast, since the thickness of W film correspondingly decreases, the interconnection resistance slightly increases. Moreover, when an acceleration voltage of 200 V is applied to the substrate at a substrate temperature of 200° C., the W—N film thickness can be increased to 150 angstroms. However, when the film thickness exceeds 100 angstroms, a coarse metal nitride film is formed, resulting in the degradation of the barrier properties.

On the other hand, when the microwave power for plasma is lowered or when the irradiation time is shortened to a range of not longer than 40 seconds, a thinner W—N film can be obtained. For instance, the thickness of the W—N film can be reduced to 8 angstroms using a plasma power of 200 W and a nitrization time of 10 seconds. It should be noted that the film having a thickness smaller than 10 angstroms exhibits a considerable lowering of barrier properties.

Accordingly, the W—N film thickness should preferably be in the range of 10 Å to 100 Å, more preferably 10 Å to 50 Å.

The plasma used for the nitrization should preferably be generated by a procedure which is able to generate a high density plasma so that the metal film surface has to be nitrided within a practical time. With a conventional radio frequency plasma at 13.56 MHz, there have not been found conditions wherein a satisfactory W—N film thickness is obtained within the practical time. This is considered for the reason that the density of the conventional radio frequency plasma is as low as approximately $1 \times 10^{10}$ cm$^{-3}$. In contrast, with ECR, the plasma density is as high as not lower than $5 \times 10^{10}$ cm$^{-3}$ so that a satisfactory film thickness is considered to be obtained through nitrization within a short time of 40 seconds.

Other plasma generation method wherein a high density plasma as with ECR is obtained include those processes of helicon plasma, ICP (inductive coupled plasma), TCP (transformer coupled plasma) and the like.

Better barrier properties are obtained when using a barrier layer having a stacked structure which is made of W—Ta alloys, Ta alloys in which Mo, Nb and/or Ti is added to Ta, and W alloys in which Mo, Nb, Pd and/or Pb is added to W and whose surface is nitrided.

[Second Embodiment]

Figure 9:
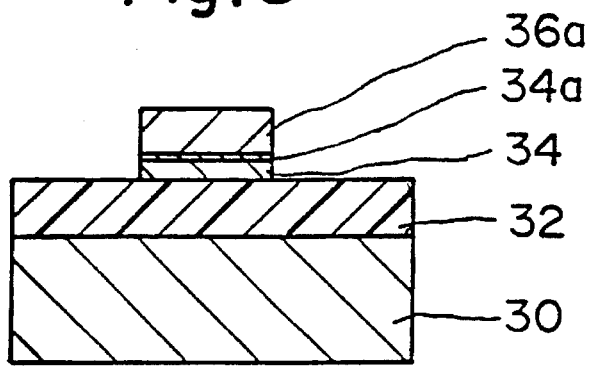
Figure 10:
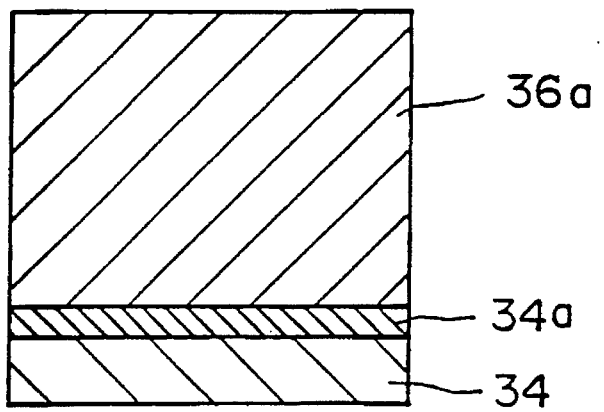

A method for manufacturing an interconnection structure using barrier materials of Nb and plasma-nitrided Nb is described with reference to FIGS. 8 to 10.

Figure 8:
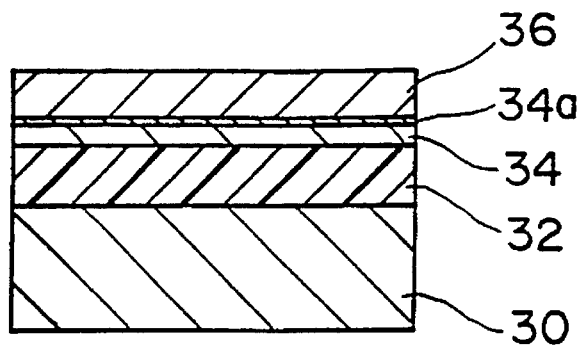
FIGS. 8 to 10 are, respectively, a sectional view showing the manufacture of an interconnection structure according to a second embodiment of the invention.

As shown in FIG. 8, an 5000 angstroms thick insulating film 32 of BSPG (borophosphosilicate glass) is formed on the surface of a Si substrate 30, followed by further formation of a Nb crystalline film 34 on the insulating film 32. The Nb crystalline film 34 is deposited in a thickness of 1000 angstroms in an atmosphere of Ar at a total pressure of 2 mTorr, by RF magnetron sputtering at a deposition rate of 10 angstroms/second. Thereafter, the Nb crystalline film 34 is subjected to irradiation on the surface thereof with an ECR plasma under conditions of a $N_2$ gas pressure of 1 mTorr (flow rate of 20 sccm) and a microwave power of 400 W for 60 seconds thereby nitrizing the surface of the film 34 to form a plasma-nitrided Nb thin film (Nb—N) 34a. Cu film 36 is further formed on the surface of the plasma-nitrided Nb thin film 34a by RF magnetron sputtering in an atmosphere of Ar at 2 mTorr, followed by pattering to form a Cu wire 36a as shown in FIG. 9. FIG. 10 is an enlarged view showing the Cu wire 36a and the underlying film provided beneath the Cu wire 36a, revealing that the amorphous Nb nitride thin film 34a is formed on the Nb crystalline film 34 by the irradiation with the plasma. It will be noted when an Al—Cu alloy film is formed instead of the Cu film 36, the Nb—N/Nb stacked film effectively acts to prevent diffusion of Cu in the Al—Cu alloy film.

[Third Embodiment]

Examples of the interconnection structure are shown along with comparative examples.

Table 2 shows electric resistances of an example which makes use of the Nb crystalline film and the plasma-nitrided Nb thin film (Nb—N) formed according to the above method, a comparative example wherein a 1000 angstroms thick Ti—N underlying film formed by reactive sputtering, and another comparative example wherein the wire is formed directly on insulating film with no underlying film. In these samples, the Al—Cu alloy wire and the underlying film are deposited in a total thickness of 1000 angstroms and the plasma-nitrided Nb thin film has a thickness of 25 angstroms to 50 angstroms.

Table 3 shows the results of SIMS (secondary-ion mass spectoscopy) in order to evaluate barrier properties against Cu in the example wherein the plasma-nitrided metal thin film formed according to the above procedure and in the comparative examples using different underlying materials. In these samples, Cu is deposited on the respective underlying layers in a thickness of 1000 angstroms and then subjected to thermal treatment in an atmosphere of H2 under conditions of 600° C.×1 hour (heating rate: 100° C./hour). These samples are analyzed by SIMS to obtain a depth profile of Cu, from which the concentration of Cu in the Si wafer is determined for comparison.

TABLE 2

| Underlying Layer Structure | Resistance (relative value) | Remarks |
|---|---|---|
| Nb—N/Nb | 0.86 | Example |
| Ti—N | 1.0 | Comparative Example |
| nil | 0.85 | Comparative Example |

TABLE 3

| Barrier Material | Cu Concentration in Si (atoms/cc) | Remarks |
|---|---|---|
| Nb | $5.2 \times 10^{19}$ | Comparative Example |
| Nb—N | $6.0 \times 10^{19}$ | Comparative Example |
| Nb—N/Nb | $1.2 \times 10^{19}$ | Example |
| Ti—N | $5.2 \times 10^{19}$ | Comparative Example |
| Ti—N/Ti | $2.2 \times 10^{19}$ | Example |
| Ta | $6.4 \times 10^{19}$ | Comparative Example |
| Ta—N | $7.4 \times 10^{19}$ | Comparative Example |

TABLE 3-continued

| Barrier Material | Cu Concentration in Si (atoms/cc) | Remarks |
|---|---|---|
| Ta—N/Ta | $1.5 \times 10^{19}$ | Example |

As shown in Tables 2 and 3, the formation of plasma-nitrided metal thin film in the surface of the underlying layer according to the example of the invention is effective in suppressing the increase of the resistance and also in remarkable reduction in amount of the Cu being diffused as compared with hitherto metal films and nitride films.

[Fourth Embodiment]

Other examples and comparative examples of interconnection structures are then described.

Table 4 shows the results of a test where Cu/M/Si (wherein M is a barrier layer) layered structures are thermally treated for diffusion of Cu and a concentration of Cu on the surface of Si is measured by use of SIMS (secondary-ion mass spectroscopy) in order to compare barrier properties against Cu of various types of barrier layers for the same layer thickness.

TABLE 4

| Barrier Material | Concentration of Cu (relative value) | Remark |
|---|---|---|
| Cr | 1 | Comparative Example |
| Mo | 0.9 | Comparative Example |
| TiN | 0.7 | Comparative Example |
| W—N/W (two layers) | 0.3 | Example |
| W—N/W (four layers) | 0.3 | Example |
| W—N/W (ten layers) | 0.2 | Example |
| Ta—N/Ta (two layers) | 0.2 | Example |
| Ta—N/Ta (four layers) | 0.3 | Example |
| Ta—N/Ta (ten layers) | 0.2 | Example |
| W—Ta—N/W—Ta (two layers) | 0.2 | Example |
| W—Ta—N/W—Ta (four layers) | 0.2 | Example |
| W—Ta—N/W—Ta (ten layers) | 0.2 | Example |
| W—Nb—N/W—Nb (two layers) | 0.3 | Example |
| W—Nb—N/W—Nb (four layers) | 0.3 | Example |
| Ta—Nb—N/Ta—Nb (two layers) | 0.2 | Example |
| Ta—Mo—N/Ta—Mo (four layers) | 0.3 | Example |
| Ta—Mo—N/Ta—Mo (ten layers) | 0.2 | Example |
| W—Ta—Mo—N/W—Ta—Mo (eight layers) | 0.2 | Example |
| W—Ta—Nb—N/W—Ta—Nb (eight layers) | 0.2 | Example |
| W—Ta—Mo—Nb—N/W—Ta—Mo—Nb (eight layers) | 0.2 | Example |

The samples of the comparative examples are made by a procedure which comprises providing a Si substrate and forming a single-layered barrier film on the substrate by RF magnetron sputtering in a thickness of 600 angstroms. On the other hand, with samples of the examples, a metal film is first formed on a Si substrate by RF magnetron sputtering, on which a plasma-nitrided metal thin film is formed in the surface of the metal film as a first layer by an ECR plasma nitrization process, followed by successive formation, on the first layer, of a metal film and a plasma-nitrided metal thin film to form a multi-layered barrier layer with a thickness of 600 angstroms. Further, Cu is deposited on the surface of the samples of the comparative examples and examples in a thickness of 5000 angstroms to obtain a layered film. Each sample having the layered film is thermally treated in an atmosphere of H2 gas under conditions of 640° C.×1 hour. Subsequently, the thermally treated sample is subjected to measurement of SIMS to determine a Cu concentration on the surface of Si substrate. As will be apparent from Table 3, the barrier layers of the example lead to significantly reduced concentration of Cu on the Si surface over those known barrier layers of Cr, Mo, Ti and the like. Thus, the excellence of the invention will be apparent.

Figure 11:
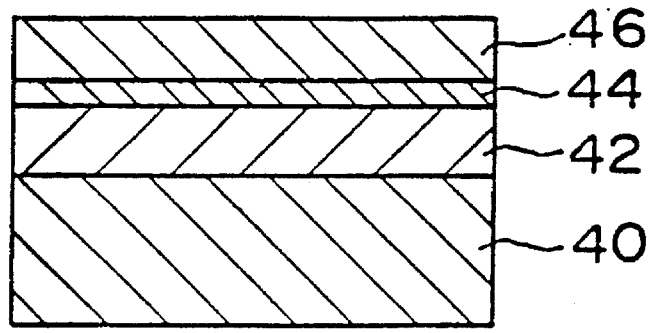
FIGS. 11 to 13 are, respectively, a sectional view showing the manufacture of an interconnection structure according to a fourth embodiment of the invention.
Figure 12:
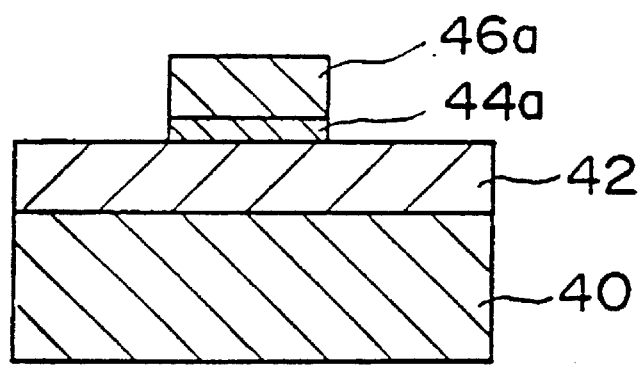
Figure 13:
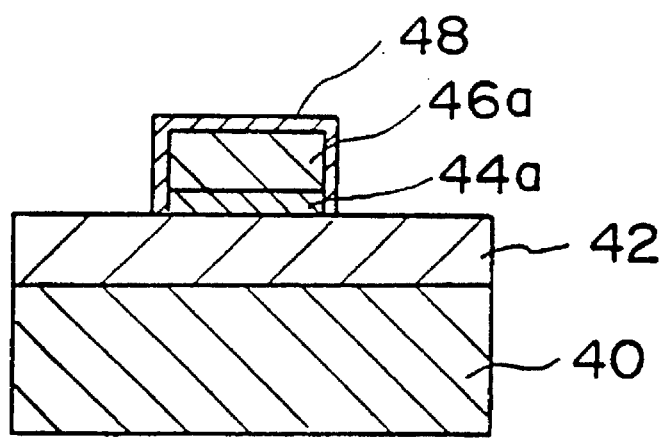

Reference is now made to FIGS. 11 to 13 with which there is described a method for forming an interconnection structure wherein a barrier layer consists of six layers formed by alternately forming the W film and the plasma-nitrided W thin film (W—N/W selected among those combinations of Table 4). As shown in FIG. 11, a 5000 angstroms thick insulating film 42 made of BSPG (borophosphosilicate glass) is formed on a Si substrate 40. A W film is deposited on the entire surface of the insulating film 42 to a thickness of 100 angstroms by RF magnetron sputtering in an atmosphere of Ar gas at a total pressure of 2 mTorr, at a deposition rate of 10 angstroms/second. The W film surface is irradiated with an ECR plasma under conditions of a $N_2$ gas pressure of 1 mTorr, and a microwave power of 400 W for 60 seconds thereby nitrizing the surface of the W film to form a plasma-nitrided film. Thus, a stacked layer consisting of the W film and the plasma-nitrided W thin film is formed. The above procedure is repeated to form a multi-layered barrier layer 44 with a thickness of 600 angstroms. A Cu film 46 is deposited on the barrier layer 44 in a thickness of 5000 angstroms by RF magnetron sputtering in an atmosphere of Ar gas at a total pressure of 2 mTorr, at a deposition rate of 60 angstroms/second. Thereafter, as shown in FIG. 12, the barrier layer 44 and the Cu film 46 are patterned to form an underlying film 44a and a Cu wire 46a. As shown in FIG. 13, W is deposited only on the outer surfaces of the underlying film 44a and the wire 46a in a thickness of 400 angstroms by use of a CVD process, thereby forming W covering film 48. The covering film 48 is formed by setting the sample temperature at 200° to 400° C., feeding a mixed gas of $WF_6$ and $H_2$ to a deposition chamber, and keeping the pressure of the mixed gas at a level not higher than 1 Torr. According to this deposition method, the surface reaction is in a rate-limiting step, so that W can be selectively deposited on the outer surfaces of the underlying film 44a and the wire 46a. In order to make a multilevel interconnection structure, an insulating film such as a $SiO_2$ film is formed on the W covering film 48, followed by formation of such an interconnection structure in a manner as set out hereinabove.

[Fifth Embodiment]

In Tables 5 to 7, there are shown the results of a test wherein barrier properties of various types of materials against Cu are compared. In order to compare the barrier properties of various types of materials, Cu/M/Si (wherein M represents a material for the barrier film) layered films are formed and thermally treated to permit diffusion of Cu. Thereafter, the Cu concentration on the surface of Si is measured according to SIMS (secondary-ion mass spectroscopy).

These layered films are obtained by depositing a 600 angstroms thick alloy barrier film on a Si substrate by RF magnetron sputtering by use of a mixed gas of $N_2$ and Ar or Ar and further depositing a 5000 angstroms thick Cu film by RF magnetron sputtering by use of Ar gas. Thereafter, the respective layered films are subjected to thermal treatment in an atmosphere of $H_2$ gas under conditions of 650° C.×1.5 hours, followed by measurement of a Cu concentration on the surface of the Si substrate by SIMS.

TABLE 5

| Barrier Material (Gas used for Film Deposition) | Cu Concentration on the Surface of Si (relative value) | Remarks |
| --- | --- | --- |
| Zr (Ar 100%) | 2 | Comparative Example |
| Ti (Ar 100%) | 1.5 | Comparative Example |
| Ta (Ar 100%) | 1.3 | Comparative Example |
| Zr—N (Ar 50%, $N_2$ 50%) | 1.4 | Comparative Example |
| Ti—N (Ar 50%, $N_2$ 50%) | 1.5 | Comparative Example |
| Ta—N (Ar 50%, $N_2$ 50%) | 1.1 | Comparative Example |
| Zr—B (Ar 100%) | 1.5 | Comparative Example |
| Ti—B (Ar 100%) | 1.5 | Comparative Example |
| Ta—B (Ar 100%) | 1.2 | Comparative Example |
| $Ta_{90}Mo_{10}$—N (Ar 50%, $N_2$ 50%) | 0.6 | Example |
| $Ta_{95}Ti_5$—N (Ar 50%, $N_2$ 50%) | 0.6 | Example |
| $Ta_{95}Nb_5$—N (Ar 50%, $N_2$ 50%) | 0.7 | Example |
| $Ta_{95}Nb_3Ti_2$—N (Ar 50%, $N_2$ 50%) | 0.7 | Example |
| $Ta_{90}Mo_{10}$—B (Ar 100%) | 0.6 | Example |
| $Ta_{95}Ti_5$—B (Ar 100%) | 0.5 | Example |
| $Ta_{95}Nb_5$—B (Ar 100%) | 0.7 | Example |
| $Ta_{95}Nb_2Ti_2Mo_1$—B (Ar 100%) | 0.6 | Example |
| $Ta_{90}Mo_{10}$—C (Ar 100%) | 0.7 | Example |
| $Ta_{95}Ti_5$—C (Ar 100%) | 0.6 | Example |
| $Ta_{95}Nb_5$—C (Ar 100%) | 0.7 | Example |
| $Ta_{90}Mo_5Nb_5$—C (Ar 100%) | 0.7 | Example |

TABLE 6

| Barrier Material (Gas used for Film Deposition) | Cu Concentration on the Surface of Si (relative value) | Remarks |
| --- | --- | --- |
| $W_{92}Mo_8$—N (Ar 50%, $N_2$ 50%) | 0.7 | Example |
| $W_{95}Pd_5$—N (Ar 50%, $N_2$ 50%) | 0.7 | Example |
| $W_{95}Pb_5$—N (Ar 50%, $N_2$ 50%) | 0.6 | Example |
| $W_{95}Nb_5$—N (Ar 50%, $N_2$ 50%) | 0.6 | Example |
| $W_{95}Pb_3Mo_2$—N (Ar 50%, $N_2$ 50%) | 0.6 | Example |
| $W_{92}Mo_8$—B (Ar 100%) | 0.5 | Example |
| $W_{95}Pd_5$—B (Ar 100%) | 0.5 | Example |
| $W_{95}Pb_5$—B (Ar 100%) | 0.6 | Example |
| $W_{95}Nb_5$—B (Ar 100%) | 0.7 | Example |
| $W_{95}Pd_2Nb_3$—B (Ar 100%) | 0.5 | Example |
| $W_{92}Mo_8$—C (Ar 100%) | 0.6 | Example |
| $W_{95}Pd_5$—C (Ar 100%) | 0.6 | Example |
| $W_{95}Pb_5$—C (Ar 100%) | 0.6 | Example |
| $W_{95}Nb_5$—C (Ar 100%) | 0.6 | Example |
| $W_{92}Mo_5Pd_2Pb_1$—C (Ar 100%) | 0.6 | Example |
| $Ta_{25}W_{75}$—N (Ar 50%, $N_2$ 50%) | 0.4 | Example |
| $Ta_{40}W_{60}$—N (Ar 50%, $N_2$ 50%) | 0.5 | Example |
| $Ta_{22}W_{70}Mo_8$—N (Ar 50%, $N_2$ 50%) | 0.3 | Example |
| $Ta_{32}W_{60}Mo_8$—N (Ar 50%, $N_2$ 50%) | 0.3 | Example |
| $Ta_{25}W_{70}Nb_5$—N (Ar 50%, $N_2$ 50%) | 0.2 | Example |
| $Ta_{35}W_{60}Nb_5$—N (Ar 50%, $N_2$ 50%) | 0.3 | Example |

TABLE 7

| Barrier Material (Gas used for Film Deposition) | Cu Concentration on the Surface of Si (relative value) | Remarks |
| --- | --- | --- |
| $Ta_{30}W_{60}Nb_5Mo_5$—N (Ar 50%, $N_2$ 50%) | 0.3 | Example |
| $Ta_{25}W_{75}$—B (Ar 100%) | 0.4 | Example |
| $Ta_{40}W_{60}$—B (Ar 100%) | 0.4 | Example |
| $Ta_{22}W_{70}Mo_8$—B (Ar 100%) | 0.2 | Example |
| $Ta_{32}W_{60}Mo_8$—B (Ar 100%) | 0.2 | Example |
| $Ta_{25}W_{70}Nb_5$—B (Ar 100%) | 0.3 | Example |
| $Ta_{35}W_{60}Nb_5$—B (Ar 100%) | 0.3 | Example |
| $Ta_{35}W_{55}Nb_5Mo_5$—B (Ar 100%) | 0.3 | Example |
| $Ta_{25}W_{75}$—C (Ar 100%) | 0.5 | Example |
| $Ta_{40}W_{60}$—C (Ar 100%) | 0.4 | Example |
| $Ta_{22}W_{70}Mo_8$—C (Ar 100%) | 0.4 | Example |
| $Ta_{32}W_{60}Mo_8$—C (Ar 100%) | 0.3 | Example |
| $Ta_{25}W_{70}Nb_5$—C (Ar 100%) | 0.4 | Example |
| $Ta_{35}W_{60}Nb_5$—C (Ar 100%) | 0.3 | Example |
| $Ta_{20}W_{70}Nb_5Mo_5$—C (Ar 100%) | 0.4 | Example |

As will be apparent from Tables 5 to 7, it will be clear that the nitrides, borides and carbides of various alloys are better than hitherto employed barrier materials with respect to the barrier effect.

Figure 14:
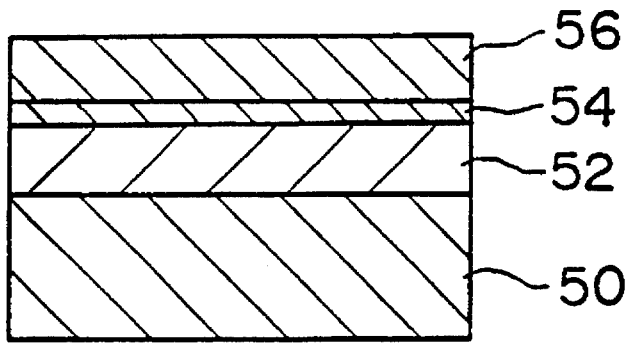
FIGS. 14 to 16 are, respectively, a sectional view showing the manufacture of an interconnection structure according to a fifth embodiment of the invention.
Figure 15:
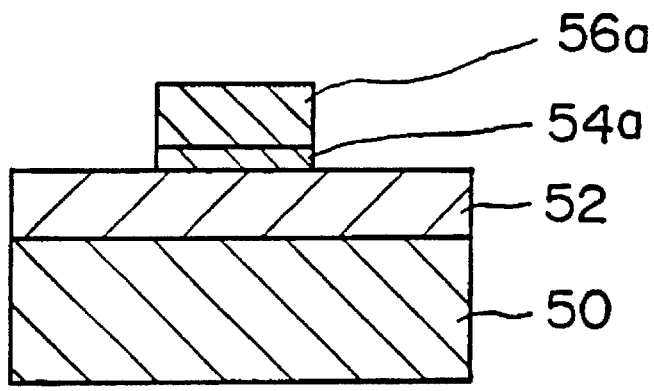
Figure 16:
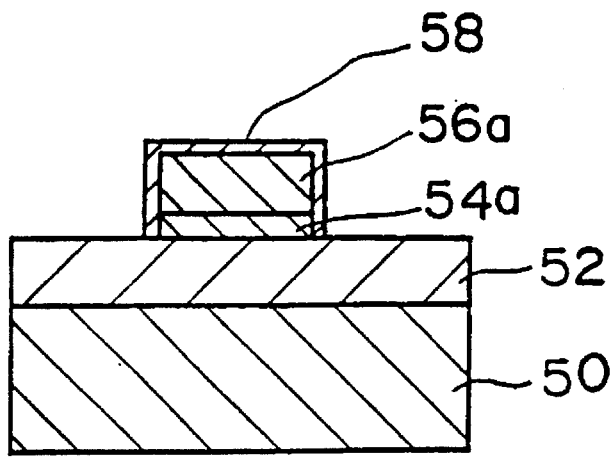

Reference is now made to FIGS. 14 to 16 to illustrate an interconnection structure and the method for manufacturing thereof according to a further embodiment of the invention.

As shown in FIG. 14, a 5000 angstroms thick BPSG (borophosphosilicate glass) insulating film 52 is formed on a Si substrate 50. A $Ta_{15}W_{80}Mo_5$—N film 54 ($Ta_{15}W_{80}Mo_5$—N indicates a nitride of an alloy consisting of 15 atomic % of Ta, 80 atomic % of W and 5 atomic % of Mo) is formed on the entire surface of the insulating film 52 at a thickness of 600 angstroms by RF magnetron sputtering in an atmosphere of 50% of Ar and 50% of $N_2$ at a total pressure of 2 mTorr, at a deposition rate of 10 angstroms/ second. A Cu film 56 is deposited on the surface of the $Ta_{15}W_{80}Mo_5$—N film 54 in a thickness of 5000 angstroms by RF magnetron sputtering in an atmosphere of Ar gas at a total pressure of 2 mTorr, at a deposition rate of 60 angstroms/second. Thereafter, as shown in FIG. 15, the $Ta_{15}W_{80}Mo_5$—N film 54 and the Cu film are subjected to patterning to form an underlying film 54a and a Cu wire pattern 56a. As shown in FIG. 16, W is selectively deposited on the outer surfaces of the underlying film 54a and the Cu wire 56a in a thickness of 400 angstroms by a CVD process to form a W covering film 58. The W covering film 58 is formed by setting the sample temperature at 200° to 400° C. and feeding a mixed gas of $WF_6$ and $H_2$ to a deposition chamber wherein the pressure of the mixed gas is controlled at a level not higher than 1 Torr. According to this deposition process, the surface reaction is a rate-limiting step, so that W can be selectively deposited only on the outer surfaces of the underlying film 54a and the Cu wire 56a. For manufacturing a multilevel interconnection structure, an insulating film such as $SiO_2$ is formed on the W covering film 58, followed by making another interconnection structure on the insulating film in the same manner as set out hereinbefore.

What is claimed is:

1. An interconnection structure for semiconductor integrated circuits which comprises a wire pattern consisting of a metal selected from Cu, Cu alloys, Au, Au alloys, Ag, Ag alloys, and Al—Cu alloys, characterized by comprising a barrier layer, which comprises at least one stacked layer consisting of a metal film and a metal nitride film formed on the metal film and formed from the metal in the metal film, as an underlying layer and/or a covering layer for the wire pattern, wherein said metal film consists of a film of a Ta—W alloy to which Mo and Nb are added.

2. An interconnection structure for an integrated circuit comprising:

a wire pattern consisting of a metal selected from Cu, Cu alloys, Au, Au alloys, Ag, Ag alloys, and Al—Cu alloys; and a substantially amorphous barrier layer of a member selected from the group consisting of nitrides, borides and carbides of Ta—W alloys, wherein a surface of the barrier layer is in contact with a surface of the wire pattern.

3. An interconnection structure for an integrated circuit comprising:

a wire pattern consisting of a metal selected from Cu, Cu alloys, Au, Au alloys, Ag, Ag alloys, and Al—Cu alloys; and a barrier layer of a member selected from the group consisting of nitrides, borides and carbides of Ta—W alloys, to which Mo is added, wherein a surface of the barrier layer is in contact with a surface of the wire pattern.

4. An interconnection structure for an integrated circuit comprising:

a wire pattern consisting of a metal selected from Cu, Cu alloys, Au, Au alloys, Ag, Ag alloys, and Al—Cu alloys; and a barrier layer of a member selected from the group consisting of nitrides, borides and carbides of Ta—W alloys, to which Nb is added, wherein a surface of the barrier layer is in contact with a surface of the wire pattern.

5. An interconnection structure for an integrated circuit comprising:

a wire pattern consisting of a metal selected from Cu, Cu alloys, Au, Au alloys, Ag, Ag alloys, and Al—Cu alloys; and a barrier layer of a member selected from the group consisting of nitrides, borides and carbides of Ta—W alloys, to which Mo and Nb are added, wherein a surface of the barrier layer is in contact with a surface of the wire pattern.

6. An interconnection structure for an integrated circuit comprising:

a wire pattern consisting of a metal selected from Cu, Cu alloys, Au, Au alloys, Ag, Ag alloys, and Al—Cu alloys; and a substantially amorphous barrier layer of a member selected from the group consisting of nitrides, borides and carbides of Ta alloys, to which at least one metal selected from Mo, Nb and Ti is added, wherein a surface of the barrier layer is in contact with a surface of the wire pattern.

7. An interconnection structure for an integrated circuit comprising:

a wire pattern consisting of a metal selected from Cu, Cu alloys, Au, Au alloys, Ag, Ag alloys, and Al—Cu alloys; and a barrier layer of a member selected from the group consisting of nitrides, borides and carbides of W alloys, to which at least one metal selected from Mo, Nb, Pd and Pb is added, wherein a surface of the barrier layer is in contact with a surface of the wire pattern.

8. An interconnection structure for an integrated circuit comprising:

a wire pattern consisting of a metal selected from Cu, Cu alloys, Au, Au alloys, Ag, Ag alloys and Al—Cu alloys; and a barrier layer comprising at least one stacked layer as one of an underlaying layer and a covering layer for the wire pattern, wherein said stacked layer consists essentially of a first transition metal film and a first amorphous transition metal nitride film formed on the transition metal film.

9. An interconnection structure according to claim 8, wherein the transition metal of the first transition metal film and of the first amorphous transition metal nitride film are the same metal.

10. An interconnection structure according to claim 8, wherein the transition metal of the first transition metal film and of the first amorphous transition metal nitride film are different metals.

11. An interconnection structure for an integrated circuit according to claim 8, further comprising a second barrier layer comprising an additional stacked layer as the other of the underlying layer and the covering layer for the wire pattern, wherein said additional stacked layer consists essentially of a second transition metal film and a second amorphous transition metal nitride film formed on the second transition metal film.

12. An interconnection structure according to claim 11, wherein the transition metal of the transition metal films and of the amorphous transition metal nitride films are the same metal.

13. An interconnection structure according to claim 11, wherein the transition metals of the transition metal films and of the amorphous transition metal nitride films are different metals.

14. The interconnection structure according to claim 11, characterized in that at least one of said first and second amorphous transition metal nitride films is one of an amorphous tungsten nitride film and an amorphous tungsten alloy nitride film.

15. The interconnection structure according to claim 11, characterized in that at least one of said first and second amorphous transition metal nitride films consists of an amorphous transition metal nitride film having a thickness within a range of 10 to 100 angstroms.

16. An interconnection structure for an integrated circuit comprising:

a wire pattern consisting of a metal selected from Cu, Cu alloys, Au, Au alloys, Ag, Ag alloys, and Al—Cu alloys; and a substantially amorphous barrier layer comprising at least one stacked layer consisting of a metal film and a metal nitride film formed on the metal film and formed from the metal in the metal film, wherein a surface of the barrier layer is in contact with a surface of the wire pattern.

17. The interconnection structure according to claim 16, wherein said metal film is a film of a metal selected from the group consisting of Ta, W and Ta—W alloys.

18. The interconnection structure according to claim 16, wherein said metal film consists of a Ta alloy to which at least one metal selected from the group consisting of Mo, Nb, Pd and Pb is added.

19. The interconnection structure according to claim 16, wherein said metal film consists of a film of a W alloy to which at least one metal selected from the group consisting of Mo, Nb, Pd and Pb is added.

20. The interconnection structure according to claim 16, wherein said metal film consists of a film of a Ta—W alloy to which Mo is added.

21. The interconnection structure according to claim 16, wherein said metal film consists of a film of a Ta—W alloy to which Nb is added.

\* \* \* \* \*